(12) United States Patent
Zhang et al.

(10) Patent No.: US 12,176,459 B2
(45) Date of Patent: Dec. 24, 2024

(54) LIGHT-EMITTING DIODE CHIP AND MANUFACTURING METHOD THEREOF

(71) Applicant: XIAMEN SAN'AN OPTOELECTRONICS TECHNOLOGY CO., LTD., Xiamen (CN)

(72) Inventors: Canyuan Zhang, Fujian (CN); Shaohua Huang, Fujian (CN); Xiaoqiang Zeng, Fujian (CN); Chen-ke Hsu, Fujian (CN)

(73) Assignee: QUANZHOU SANAN SEMICONDUCTOR TECHNOLOGY CO., LTD., Quanzhou (CN)

(*) Notice: Subject to any disclaimer, the term of this patent is extended or adjusted under 35 U.S.C. 154(b) by 631 days.

(21) Appl. No.: 17/225,137

(22) Filed: Apr. 8, 2021

(65) Prior Publication Data
US 2021/0226088 A1 Jul. 22, 2021

Related U.S. Application Data

(63) Continuation-in-part of application No. PCT/CN2018/109910, filed on Oct. 11, 2018.

(51) Int. Cl.
H01L 33/38 (2010.01)
H01L 33/00 (2010.01)
H01L 33/14 (2010.01)
H01L 33/64 (2010.01)

(52) U.S. Cl.
CPC .......... *H01L 33/14* (2013.01); *H01L 33/0093* (2020.05); *H01L 33/382* (2013.01); *H01L 33/642* (2013.01)

(58) Field of Classification Search
None
See application file for complete search history.

(56) References Cited

U.S. PATENT DOCUMENTS

| 9,324,904 | B2* | 4/2016 | Yang | H01L 33/0075 |
| 2009/0039359 | A1 | 2/2009 | Yoon et al. | |
| 2011/0049537 | A1* | 3/2011 | Lee | H01L 33/48 257/E33.055 |
| 2012/0025250 | A1 | 2/2012 | Hsieh et al. | |

(Continued)

FOREIGN PATENT DOCUMENTS

| CN | 101867002 A | 10/2010 |
| CN | 103563104 A | 2/2014 |

(Continued)

*Primary Examiner* — Suberr L Chi
*Assistant Examiner* — Carnell Hunter, III

(57) ABSTRACT

Disclosed is a light-emitting diode chip. A first electrode and a second electrode of the light-emitting diode chip face towards a front side. A back side of a first conduction layer is directly connected to a front side of a base. A portion of the first conduction layer is at least exposed from the front side to be used for the arrangement of the first electrode. A portion of a second conduction layer is at least exposed from the front side to be used for the arrangement of the second electrode. The exposed first conduction layer and the exposed second conduction layer are of equal height. An insulating layer extending from a recess covers a back side of the second conductive layer.

19 Claims, 8 Drawing Sheets

(56) References Cited

U.S. PATENT DOCUMENTS

| | | | | |
|---|---|---|---|---|
| 2012/0086043 A1* | 4/2012 | Cho | ...................... | H01L 33/382 |
| | | | | 257/E33.064 |
| 2016/0027980 A1* | 1/2016 | Hahn | .................... | H01L 33/486 |
| | | | | 257/459 |
| 2018/0254384 A1* | 9/2018 | Hartmann | ............. | H01L 33/387 |

FOREIGN PATENT DOCUMENTS

| | | | |
|---|---|---|---|
| CN | 103765616 | A | 4/2014 |
| CN | 104810436 | A | 7/2015 |
| CN | 106409997 | A | 2/2017 |
| DE | 102013101598 | A1 | 8/2014 |
| EP | 2290689 | A2 | 3/2011 |
| JP | 2001024222 | A | 1/2001 |
| JP | 2008529271 | A | 7/2008 |
| JP | 2012138499 | A | 7/2012 |
| JP | 2014195055 | A | 10/2014 |
| JP | 2016518709 | A | 6/2016 |
| JP | 2017054963 | A | 3/2017 |
| JP | 2018530917 | A | 10/2018 |
| JP | 2019519935 | A | 7/2019 |
| KR | 20080035889 | A | 4/2008 |
| KR | 100891761 | B1 | 4/2009 |
| KR | 20180006821 | A | 1/2018 |

* cited by examiner

LIGHT-EMITTING DIODE CHIP AND MANUFACTURING METHOD THEREOF

CROSS REFERENCE TO RELATED APPLICATIONS

This application is a Continuation-in-Part of International Application No. PCT/CN2018/109910, filed on Oct. 11, 2018, the entirety of which is incorporated by reference herein for all purposes.

TECHNICAL FIELD

The present disclosure relates to the field of the semiconductor technology, and particularly to a chip structure of light-emitting diodes and a manufacturing process.

BACKGROUND

Light-emitting diodes (LEDs) having high-power and high-brightness have been highlighted under the current high-brightness lighting market demands. LEDs in a horizontal structure, which adopt sapphire as a substrate, due to the heat dissipation problem and current-crowding effect of the sapphire, is easy to be overheated and cause the chip to be burned out when operating at a high current density. Therefore, high-power LEDs cannot adopt the horizontal structure. However, LEDs in a vertical structure can operate at an ultra-high current density (for example: 2.5 A/mm2 or above), since its substrate can be replaced with a material (such as Si, CuW, or the like) with good heat dissipation and thermal conductivity, the vertical structure has no current-crowding effect, and the current can be well spread, thereby realizing the high-power and the high-brightness of LEDs. In order to obtain a better current spread, how to further achieve higher current density, brightness and reliability of vertical LEDs and achieve high-power light-emitting diodes is a hot topic in the current LED market.

SUMMARY

According to one aspect of the present disclosure, a light-emitting diode chip is provided, which includes a semiconductor layer sequence and a first conduction layer and a second conduction layer located at a back side of the semiconductor layer sequence. The semiconductor layer sequence includes a first-type semiconductor layer, a second-type semiconductor layer, and an active layer located between the first-type semiconductor layer and the second-type semiconductor layer and configured to generate radiation. The first-type semiconductor layer is located at a front side of the semiconductor layer sequence. The semiconductor layer sequence has a recess with at least one side wall thereof covered with an insulating layer. The recess extends from the back side of the semiconductor layer sequence opposite to the front side through the active layer and extends to the first-type semiconductor layer. The second conduction layer directly contacts a back side of the second-type semiconductor layer. The first conduction layer and the second conduction layer are insulated from each other by an insulating layer. The semiconductor layer sequence further includes a first electrode connected to the first conduction layer and electrically connected to the first-type semiconductor layer by the first conduction layer extending through the recess, a second electrode connected to the second conduction layer, and a base for support and heat-dissipation. The first electrode and the second electrode face towards the front side of the semiconductor layer sequence, a back side of the first conduction layer being directly connected to a front side of the base, at least a portion of a front side of the first conduction layer being exposed for the arrangement of the first electrode, at least a portion of a front side of the second conduction layer being exposed for the arrangement of the second electrode, and the insulating layer extending from the recess and covering a back side of the second conduction layer.

According to another aspect of the present disclosure, a method of manufacturing a light-emitting diode chip is provided, which includes: step 1, forming a semiconductor layer sequence on a growth substrate, the semiconductor layer sequence comprising a first-type semiconductor layer, an active layer, and a second-type semiconductor layer; step 2, digging a plurality of recesses extending through the second-type semiconductor layer and the active layer from a back side of the second-type semiconductor layer, the recesses extending at least to the first-type semiconductor layer; step 3, covering a non-recessed region on a surface of the second-type semiconductor layer with a conduction layer, the conduction layer comprising a first conduction layer and a second conduction layer located on the same horizontal plane, and covering the conduction layer, a bottom and a side wall of the recess with an insulating layer; step 4, digging vias on the insulating layer, and exposing at least the first-type semiconductor layer at the bottom of the recess and a portion of the first conduction layer; step 5, further covering the bottom of the recess, the insulating layer, and the portion of the first conduction layer with a material of the first conduction layer; step 6, connecting directly a back side of the first conduction layer to a heat-dissipation base; step 7, removing the growth substrate; step 8, removing a portion of the semiconductor layer sequence from a front side of the first-type semiconductor layer to expose the first conduction layer and the second conduction layer; step 9, forming a first electrode on the exposed first conduction layer, and forming a second electrode on the exposed second conduction layer.

According to yet another aspect of the present disclosure, a light-emitting diode element is provided, which includes a plurality of light-emitting diode units. Each light-emitting diode unit includes a semiconductor layer sequence that includes a first-type semiconductor layer, a second-type semiconductor layer, and an active layer located between the first-type semiconductor layer and the second-type semiconductor layer and configured to generate radiation. The first-type semiconductor layer is located at a front side of the semiconductor layer sequence. The semiconductor layer sequence has a recess with at least one side wall thereof covered with an insulating layer. The recess extends from a back side of the semiconductor layer sequence opposite to the front side through the active layer and extends to the first-type semiconductor layer. Each light-emitting diode unit further includes a first conduction layer and a second conduction layer located at the back side of the semiconductor layer sequence. The first conduction layer extends through the recess and is connected to the first-type semiconductor layer. The second conduction layer directly contacts a back side of the second-type semiconductor layer. The first conduction layer and the second conduction layer are insulated from each other by an insulating layer. The second conduction layer of one of any two adjacent light-emitting diode units and the first conduction layer of the other light-emitting diode unit are integrally connected by a connection portion.

BRIEF DESCRIPTION OF THE DRAWINGS

The accompanying drawings are used to provide a further understanding of the present disclosure, and constitute a part of the specification. Together with the embodiments of the present disclosure, they are used to illustrate the present disclosure and do not constitute a limitation to the present disclosure. In addition, the data of the accompanying drawings is an overall description, not drawn to scale.

Figure 1:
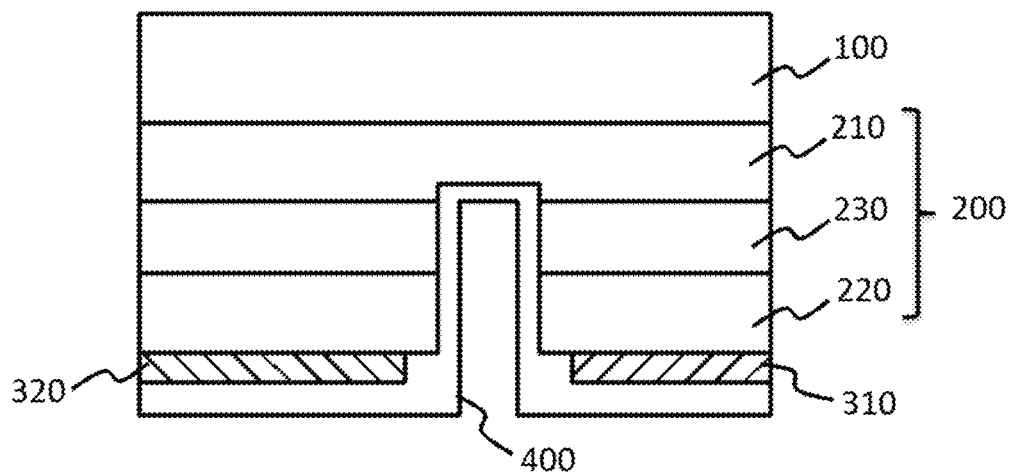
FIG. 1 is a diagram illustrating a structure manufactured by steps 1 to 3 of a first embodiment.

The references in the drawings are listed below: 100, growth substrate; 200, semiconductor layer sequence; 210, first-type semiconductor layer; 220, second-type semiconductor layer; 230, active layer; 310, first conduction layer; 320, second conduction layer; 400, insulating layer; 500, base; 610, first electrode; 620, second electrode.

DETAILED DESCRIPTION

Objects of the embodiments of the present disclosure is to provide thin-film light-emitting diodes having higher efficiency, higher current density, and higher electrical performance and reliability under a high voltage. These objects are solved by the thin-film light-emitting diode structure and the process method for manufacturing the structure of the independent claims. The modified solutions and improved solutions of the present disclosure are respectively described in the dependent claims, and their contents are hereby explicitly incorporated in the description.

In order to address the needs on increasing the brightness mentioned in the background, on the one hand, one embodiment of the present disclosure provides a light-emitting diode chip that includes a semiconductor layer sequence including an active layer, the active layer being disposed between a first-type semiconductor layer and a second-type semiconductor layer and configured to generate radiation. The first-type semiconductor layer is located at a front side of the semiconductor layer sequence. The semiconductor layer sequence includes a recess, and at least one side wall of the recess is covered with an insulating layer. The recess extends from a back side of the semiconductor layer sequence opposite to the front side through the active layer and extends to the first-type semiconductor layer. A first electrode is connected to a first conduction layer, and a second electrode is connected to a second conduction layer. The first-type semiconductor layer is electrically connected by first conduction layer extending through the recess. The first conduction layer and the second conduction layer are insulated from each other by the insulating layer extending from the recess. The first conduction layer and the second conduction layer are located at the back side of the semiconductor layer sequence. The first conduction layer located at the back side of the semiconductor layer sequence refers to the first conduction layer excluding the first conduction layer in the recess. The second conduction layer contacts a back side of the second-type semiconductor layer, and the conduction layers are made of materials having good heat dissipation.

A base is provided for support and heat dissipation. The base is not a growth substrate on which the semiconductor layer sequence epitaxially grows, rather, it is a separate support element. The semiconductor layer sequence do not have a growth substrate in the above-mentioned structure. "Do not have a growth substrate" here means that the growth substrate used, if necessary, in growing has been removed from the semiconductor layer sequence, or at least has been greatly thinned.

The first conduction layer is connected to the front side of the base. The contact area between the first conduction layer and the back side of the first-type semiconductor layer is greater than 1.5% of the area of the first-type semiconductor layer. At least a portion of the first conduction layer at the front side of the first conduction layer is exposed for disposing the first electrode. At least a portion of the second conduction layer at the front side of the second conduction layer is exposed for exposing the second electrode. The exposed first conduction layer and the exposed second conduction layer are of equal height. Due to the equal-height design, when removing the semiconductor layer sequence to form a wiring window, the exposed window can be realized as long as the layers from the conduction layers to the first conduction layer have been removed, rather than penetrating the portions that are hardly to be removed, such as the insulating layer or the metal layers, which decreases the process period of time, and improves the process reliability, for example, avoiding the problems, such as, ICP ion beam-assisted free radical etching which hits the metal to the sidewall of semiconductor layer sequence and causes short circuits, or the low efficiency of wet etching metal and insulating layer. The insulating layer extending from the recess covers the back sides of the first conduction layer and the second conduction layer. "The insulating layer extending from the recess covers the back side of the second conduction layer" here means that the insulating layer horizontally extending from the recess covers at least a partial region of the back side of the second conduction layer. In some embodiments, the entire back side of the second conduction layer can be fully covered by the insulating layer. The second conduction layer, especially the first conduction layer, can be configured having multiple layers in the vertical direction, and can have a structure that the front side is covered by the insulating layer. The first electrode and the second electrode face towards the front side. In an embodiment of the present disclosure, the entire second conduction layer covers the front side of the insulating layer. The first electrode and the second electrode in the present disclosure are referred to electrical contact regions, such as bonding pads, which are suitable for electrically contacting the LED body from the positive side. The first electrode and the second electrode are formed on the same plane, that is, the windows of the first conduction layer and the second conduction layer, which are exposed to form the electrodes, are on the same plane, which is advantageous to manufacture the entire structure, simplify the processes, and form the electrodes having the equal heights. The non-equal-height electrodes will increase the difficulty of wiring and decrease the efficiency of wiring. The first electrode and the second electrode are located at the sides of the semiconductor layer sequence, which not only avoids that the radiation is occluded by the first electrode and/or the second electrode arranged on the semiconductor layer sequence, thereby reducing the efficiency of the radiation, but also facilitates the manufacture of wiring. The first electrode is configured to be electrically connected to the front side of the first conduction layer. Likewise, the second electrode is configured to be electrically connected to the front side of the second conduction layer.

It is advantageous that the first conduction layer is respectively connected to the heat-dissipation base and the first-type semiconductor layer, thereby constituting a good heat-conduction passage to conduct the heat from the first-type semiconductor layer to the heat-dissipation base. Since the excited radiation of the multiple quantum well is emitted through the first type semiconductor layer, heat is easily accumulated in the first type semiconductor layer. The first conduction layer of the present disclosure well conducts the heat from the first type semiconductor layer to the heat-dissipation base.

In addition, the first electrode and the second electrode face towards the front side and the exposed first conduction layer and second conduction layer have the equal height and located at the sides of the semiconductor layer sequence, which is suitable to form a series-connection configuration and/or a parallel-connection configuration, thereby facilitating to be adopted as a unit part designed as a high-voltage structure.

In some modified embodiments of the present disclosure, preferably, the contact area between the first conduction layer and the back side of the first-type semiconductor layer is from equal to or greater than 2.3% to equal to or less than 2.8% of the area of the first-type semiconductor layer, from greater than 2.8% to less than 4%, or from equal to or greater than 4% to equal to or less than 6%, wherein it is more advantageous to conduct the heat from the first-type semiconductor layer when it is from equal to or greater than 4% to equal to or less than 6%.

According to the present disclosure, preferably, the first conduction layer and/or the second conduction layer are/is made of metal. The metal conductive material has a better thermal conductivity with respect to a non-metal conductive material.

According to the present disclosure, preferably, the opening diameter of the recess is from equal to or greater than 15 μm to less than 32 μm, or from equal to or greater than 32 μm to equal to or less than 40 μm. The better thermal conductivity and heat dissipation can be achieved by decreasing the opening diameter of the recess to increase the thermal resistance, instead of merely increasing the number of the recesses to increase the total area.

In some embodiments of the present disclosure, preferably, when the opening diameter of the recess is from equal to or greater than 34 μm to equal to or less than 36 μm, a number of the recesses is from 20 to 25.

In some modified embodiments of the present disclosure, preferably, the first-type semiconductor layer has a thickness not less than 2 μm, and a depth of the recess in the first-type semiconductor layer is not less than 0.6 μm. This design focuses more on solving the problem of heat accumulation in the first type of semiconductor layer.

According to the present disclosure, preferably, in order to degrade the absorption of the first-type semiconductor layer on the radiation, the first-type semiconductor layer has a thickness of 2 μm to 3 μm.

According to the present disclosure, preferably, the insulating layer has an effect to electrically isolate the first conduction layer and the second conduction layer from each other. The electrical isolation referred herein does not refer to not being electrically connected to each other, rather, it refers that the first conduction layer and the second conduction are not electrically contact to each other directly to avoid short circuits. The adoptable material includes silicon oxide, silicon nitride, aluminum nitride, aluminum oxide or ceramics.

According to the present disclosure, preferably, the first conduction layer includes an ohmic-contact layer, a metal reflection layer, a metal bonding layer, or any combinations thereof.

According to the present disclosure, preferably, the second conduction layer includes a transparent conduction layer, a metal reflection layer, a metal-diffusion blocking layer, or any combination thereof.

The first conduction layer includes the ohmic-contact layer, such as Cr, Ni, Au, Li, and the like, having a good electrical connection with the first-type semiconductor layer. The metal reflection layer is applied or formed between a support element which the semiconductor layer sequence generating radiation face to, especially the support base, and the semiconductor layer sequence. The metal reflection layer reflects at least a portion of the electromagnetic radiation back to the semiconductor layer sequence, wherein the semiconductor layer sequence generating the radiation especially are the series of epitaxial layers generating the radiation. The material of the metal reflection layer can for example Ag. The bonding layer is substantially referred to the metal of the first conduction layer having good bonding characteristic, generally, for example, Au. In order to improve the contact between the conduction layers and the semiconductor layers, and reduce the resistance therebetween, a transparent contact layer (TCL) can also be added between the conduction layers and the semiconductor layers, for example, adding a layer of ITO. The conduction layers referred here includes the first conduction layer and the second conduction layer, and the semiconductor layers includes the corresponding first-type semiconductor layer and the second conduction layer. The transparent contact layer TCL is interposed in any one of the groups or in the both groups.

According to the present disclosure, preferably the material of the second conduction layer is Ag, Au, Ti, Al, Cr, Pt, TiW, Ni, or any combination thereof, wherein Ag is adaptable to be the metal reflection material, TiW is adaptable to be the metal covering material to prevent the metal diffusion, and Cr, Ni, Au are adaptable to be the ohmic-contact material.

According to the present disclosure, preferably, the semiconductor layer sequence is a thin-film structure that has a height preferably from equal to or greater than 5 μm to equal to or less than 7 μm, or from greater than 7 μm to equal to or less than 8 μm.

According to the present disclosure, preferably, at least a portion of the electrical connection layer and the second conduction layer are manufactured together, and located on the same plane. The exposed first conduction layer and the first conduction layer located at the back side of the insulating layer are manufactured in different processes.

According to the present disclosure, preferably, the chip includes the second conduction layer, the insulating layer and the first conduction layer, which are stacked sequentially from top to bottom. Since the first conduction layer directly contacts the heat-dissipation base, the first conduction layer can also conduct the heat of the insulating layer.

According to the present disclosure, preferably, the thermal conductivity coefficient of the base at 100° C. is not less than 150 W/(m·k), for example, Si, Cu, or ceramic. Especially, for the chip adopting the ceramic base, on the one hand, the ceramic base has good heat dissipation by cooperating with the first conduction layer to better conduct heat from the first conduction layer. On the other hand, due to the insulation characteristic of the ceramic base, it is advantageous to form a plurality of semiconductors arranged in a series-connection configuration and/or a parallel-connection configuration on the same base of high-voltage products. The first conduction layer covers the entire front side of the ceramic base. The entire front side of the base mentioned here refers that the first conduction layer covers the most region on the base, rather than a 100% coverage, since in the actual product, some margin space may be reserved on the base to facilitate for example the separation process.

Based on the structure of the above-mentioned light-emitting diode chip, the present disclosure further provides a method for manufacturing a light-emitting diode chip, including following steps.

At step 1, a semiconductor layer sequence is formed on a growth substrate by an epitaxial process such as metalorganic chemical vapor deposition (MOCVD). The semiconductor layer sequence includes a first-type semiconductor layer, an active layer, and a second-type semiconductor layer. The first-type semiconductor layer, the active layer, and the second-type semiconductor layer constitute a PN-junction with radiation capability.

At step 2, a recess extending through the second-type semiconductor layer and the active layer is dug from a back side of the second-type semiconductor layer. The recess extends at least to the first-type semiconductor layer. A number of the recesses is one or plural.

At step 3, a non-recessed region on a surface of the second-type semiconductor layer are covered with a conduction layer. A surface of the second-type semiconductor layer proximate to the recess is not covered with the conduction layer due to limitation of process accuracy. The conduction layer includes a first conduction layer and a second conduction layer located on the same horizontal plane. The conduction layer, a bottom and a side wall of the recess are covered with an insulating layer.

At step 4, vias are dug on the insulating layer, and at least the first-type semiconductor layer at the bottom of the recess and a portion of the first conduction layer are exposed.

At step 5, the bottom of recess, the insulating layer, and the portion of the first conduction layer are further covered with a first conductive material. In order to facilitate the description of the present disclosure, an ohmic-contact layer contacting the first-type semiconductor layer, a metal reflection layer, and a metal bonding layer contacting a base are defined as the first conduction layer. In this step, a material of the first conduction layer at the bottom of the recess is an ohmic-contact material, and a material of the first conduction layer on the insulating layer and on the exposed portion of the first conduction layer is substantially the metal bonding layer.

At step 6, a back side of the first conduction layer is directly connected to a heat-dissipation base.

At step 7, the growth substrate is removed.

At step 8, a portion of the semiconductor layer sequence is to be removed from a front side of the first-type semiconductor layer to expose the conduction layers.

At step 9, a first electrode is formed on the first conduction layer of the exposed conduction layers, and a second electrode is formed on the second conduction layer of the exposed conduction layers.

Compared to the prior art, the light-emitting diode chips provided by the present disclosure have technical effects:

The reliability of products is improved, especially the heat of the first-type semiconductor layer is conducted, when the first electrode and the second electrode face towards to the front side; the first conduction layer contacts respectively the front side of the base and the back side of the first-type semiconductor layer, and the contact area is greater than 1.5% of the area of the first-type semiconductor layer; and the heat of the semiconductor layer sequence is conducted through the first conduction layer to the heat-dissipation base.

During operating, the current vertically passes through the semiconductor layer sequence, which has the characteristics of uniform distribution of the vertical current of the light-emitting diode.

The first electrode and the second electrode face towards the front side, and the uniform distribution of current is realized by the recess, which facilitates the series-connection configuration and/or the parallel-connection configuration. The series-connection configuration and/or the parallel-connection configuration formed on the growth substrate are/is advantageous for the unit part (COB, the chip-on-board market) adopted as the high-voltage structure having the good high-voltage characteristic.

For example, in the specific application such as UVLED in the field of UV curing, UV light is more easily absorbed by the material of the semiconductor layer sequence, and with respect to the problem of enlarged heat dissipation, the thermoelectric separation configuration of the chip structure of the present disclosure can advantageously conduct the heat of the first-type semiconductor layer of the light-output surface through the heat-dissipation base.

According to the above-mentioned structure of the light-emitting diode chip and the manufacturing method, a light-emitting diode element is further designed, including a plurality of light-emitting diode units.

The light-emitting diode units are connected to one another in series.

The semiconductor layer sequence between the light-emitting diode units are isolated from each other. The above-mentioned series-connection substantially is referred to in series connecting the semiconductor layer sequence isolated from each other. The semiconductor layer sequence has an active layer located between the first-type semiconductor layer and the second-type semiconductor layer and configured to generate radiation, wherein the first-type semiconductor layer is located at a front side of the semiconductor layer sequence;

The semiconductor layer sequence includes one or more recesses covered with an insulating layer, and the recesses extend through the active layer from a back side of the semiconductor layer sequence opposite to the front side and extends to the first-type semiconductor layer.

The first conduction layer extends through the recesses and is electrically connected to the first-type semiconductor layer, and the second conduction layer is electrically connected to the second-type semiconductor layer.

The first conduction layer and the second conduction layer are insulated from each other by the insulating layer from the recesses.

In the first light-emitting diode unit of the plurality light-emitting diode units, at least a portion of the first conduction layer is exposed, and the first light-emitting diode unit has a first electrode electrically connected to the exposed first conduction layer. In the last light-emitting diode unit, at least a portion of the second conduction layer is exposed, and the last light-emitting diode unit has a second electrode electrically connected to the second conduction layer. The first electrode and the second electrode are located outside the light-emitting diode element. The light-emitting areas can be concentrated inside the light-emitting diode element, thereby having a relatively intensive concentration of light-outputs.

The first electrode and the second electrode face towards the front side. The back side of the first conduction layer is connected to the front side of the base. The contact area between the front side of the first conduction layer and the back side of the first-type semiconductor layer is greater than 1.5% of the area of the first-type semiconductor layer 210. The insulating layer extending from the recess covers the back side of the second conduction layer. A second conduction layer of one of any two adjacent light-emitting diode units and a first conduction layer of the other light-emitting diode unit are provided a connection portion integrally connected thereto.

The plurality of light-emitting diode elements share the same support and heat-dissipation base. The base is an independent support element, rather than the growth substrate on which the semiconductor layer sequence epitaxially grows. The semiconductor layer sequence does not have any growth substrate in the above-mentioned structure. "Do not have a growth substrate" here means that the growth substrate used, if necessary, in growing has been removed from the semiconductor layer sequence, or at least has been greatly thinned.

In some embodiments of the present disclosure, at least a portion of the integrally connected connection portion is expose between the semiconductor layer sequence isolated from each other. For example, in one of the light-emitting diode unit, the second conduction layer is exposed, and in another light-emitting diode unit, the first conduction layer is exposed, wherein the two conduction layers are integrally connected to each other. The connection portion integrally connected thereto is exposed between the semiconductor layer sequence isolated from each other. The second conduction layer exposed in the first light-emitting diode unit and the first conduction layer exposed in the second light-emitting diode unit are of equal height. The equal height here substantially refers that the second conduction layer exposed in the first light-emitting diode unit and the first conduction layer exposed in the second light-emitting diode unit are equal to each other in height at the front side. Furthermore, they have the same thickness, material, and configuration. It needs, during patterning the conduction layers, only to isolate the second conduction layer of the first light-emitting diode unit from the first conduction layer thereof, and isolate first conduction layer of the second light-emitting diode unit from the second conduction layer thereof. The second conduction layer of the first light-emitting diode unit and the first conduction layer of the second light-emitting diode unit are not referred to the entire structure of the conduction layer, but are particularly referred to a portion of the second conduction layer of the first light-emitting diode unit and a portion of the first conduction layer of the second light-emitting diode unit, which are proximate to the semiconductor layer sequence. In addition to these conduction layers, other conduction layers, such as a metal bonding layer, will be formed by further processes, such as evaporation.

In the above-mentioned embodiments, a portion of the insulating layer of each light-emitting diode unit is exposed at the front side. At least a portion of the integrally connected connection portion is located under the portion of the insulating layer, thereby avoiding the performance degradation caused by the damage on the directly exposed connection portion.

According to the present disclosure, preferably, the plurality of light-emitting diode units have the same chip structure. The same chip structure here refers to forming a repeated graphic to obtain structures similarly having a semiconductor layer sequence, a first conduction layer, a second conduction layer, and an insulating layer. The same chip structures here are not required the same exactly to each other, In particular, the portions of electrodes (wire-bonding electrodes) can be designed in different shapes or combined arbitrarily to each other according to requirements.

According to the present disclosure, preferably, the plurality of light-emitting diode units are formed by the semiconductor layer sequence integrally growing on the same growth substrate.

In some embodiments of the present disclosure, preferably, the contact area between the first conduction layer and the back side of the first-type semiconductor layer is from equal to or greater than 4% to equal to or less than 6% of the area of the first-type semiconductor layer 210, which is adaptable for the higher heat dissipation requirements, for example, solving the heat dissipation problem under larger loads.

In some embodiments of the present disclosure, preferably, the first conduction layer and/or the second conduction layer include metal. The metal conductive material has a better thermal conductivity with respect to a non-metal conductive material.

In some embodiments of the present disclosure, preferably, the semiconductor layer sequence has a height not greater than 7 μm, and belong to semiconductor thin-film chips.

Each light-emitting diode unit includes a second conduction layer, an insulating layer, and a first conduction layer, which are stacked sequentially from top to bottom. Since the first conduction layer directly contacts the heat-dissipation base, the first conduction layer can also conduct the heat of the insulating layer.

In some embodiments of the present disclosure, preferably, the material of the base is ceramic. Compared to metal, ceramics can not only ensure good heat dissipation characteristics, but also improve the reliability of the entire element using the insulation.

In some embodiments of the present disclosure, preferably, the first conduction layers of two adjacent light-emitting diode units are isolated from each other by the insulating layer.

In some embodiments of the present disclosure, preferably, the light-emitting diode element includes 3 to 6, or 7 to 9 light-emitting diode units. Compared to the conventional structure, the more light-emitting diode units connected in series, the more advantageous by having light concentration or heat dissipation the present disclosure is.

A method of manufacturing a light-emitting diode element, configured to manufacture a high-voltage light-emitting device, includes following steps.

At step 1, a semiconductor layer sequence is formed on a growth substrate, and the semiconductor layer sequence includes a first-type semiconductor layer, an active layer, and a second-type semiconductor layer.

At step 2, a plurality of recesses extending through the second-type semiconductor layer and the active layer are dug from a back side of the second-type semiconductor layer, and the recesses extend at least to the first-type semiconductor layer.

At step 3, a non-recessed region on a surface of the second-type semiconductor layer are covered with a conduction layer. The conduction layer includes n pairs of a first conduction layer and a second conduction layer located on the same horizontal plane, where n≥2. The conduction layer, a bottom and a side wall of the recess are covered with an insulating layer.

At step 4, vias are dug on the insulating layer, and at least the first-type semiconductor layer at the bottom of the recess and a partial region of n first conduction layers are exposed.

At step 5, the bottom of the recess, the insulating layer, the partial region of the n first conduction layers is further covered with a material of the first conduction layer, and the insulating layer is disposed between the n first conduction layers to isolate the n first conduction layers. During manufacturing, it is not required to strictly follow the order described in the description to determine the order of covering the material of the first conduction layer in the processes, that is, the order can be adjusted arbitrarily according to requirements.

At step 6, a back side of the first conduction layer is directly connected to a heat-dissipation base.

At step 7, the growth substrate is removed.

At step 8, a portion of the semiconductor layer sequence is to be removed from a front side of the first-type semiconductor layer to expose the first conduction layer and the second conduction layer to form n semiconductor layer sequence isolated from each other.

At step 9, a first electrode is formed on the first conduction layer exposed by a first semiconductor layer sequence, and a second electrode is formed on the second conduction layer exposed by a last semiconductor layer sequence.

Compared to the prior art, the present disclosure provides a light-emitting diode unit. The technical effects thereof include that by providing a high-voltage light-emitting diode having good heat dissipation, it is easy to manufacture an array of high-voltage light-emitting diodes using the configuration of the light-emitting diode unit according to the present disclosure.

The other characteristics and advantages of the present disclosure will be illustrated in the following description, and be partly apparent from the description, or be understood through implementing the present disclosure. The purpose and other advantages of the present disclose can be achieved and obtained through the structures specifically illustrated in the description, claims and drawings.

The light-emitting diode chip and the manufacturing method thereof according to present disclosure will be described in detail below in conjunction with the drawings. Before further illustrating the present disclosure, it should be understood that since specific embodiments can be modified, the present disclosure is not limited to the following specific embodiments. It should also be understood that since the protection scope of the present disclosure is only limited by the appended claims, the embodiments adopted are only illustrative rather than restrictive. Unless otherwise specified, all technical and scientific terms used here have the same meaning as commonly understood by those of ordinary skill in the art.

FIGS. 1 to 5 illustrate a method of manufacturing an optoelectronic semiconductor body according to a first embodiment by schematic section diagrams in different phases of the method.

In the first embodiment, provided are firstly steps of a process of manufacturing a light-emitting diode chip configured to emit light from the front side, including following steps.

Referring to FIG. 1, a structure manufactured from step 1 to step 3 is illustrated.

At step 1, a semiconductor layer sequence 200 is formed on a growth substrate 100 as a light-emitting epitaxial layer, and the semiconductor layer sequence 200 includes a first-type semiconductor layer 210, an active layer 230, and a second-type semiconductor layer 220. The semiconductor layer sequence 200 in the embodiment is substantially a light-emitting PN-junction, the first-type semiconductor layer 210 is an N-type semiconductor layer, the second-type semiconductor layer 220 is a P-type semiconductor layer. The correspondence can also be reversed according to the design. The active layer 230 is a multiple quantum well configured to generate radiation. At step 2, a recess extending through the second-type semiconductor layer 220 and the active layer 230 is dug from a back side of the second-type semiconductor layer 220, and the recesses extends at least to the first-type semiconductor layer 210, or can extend into the first-type semiconductor layer 210. At step 3, non-recess positions on a surface of the second-type semiconductor layer are covered with a conduction layer, and the conduction layer includes a first conduction layer 310 and a second conduction layer 320, which are located on the same horizontal plane. The conduction layer, a bottom and a side wall of the recess are covered with an insulating layer 400.

Figure 2:
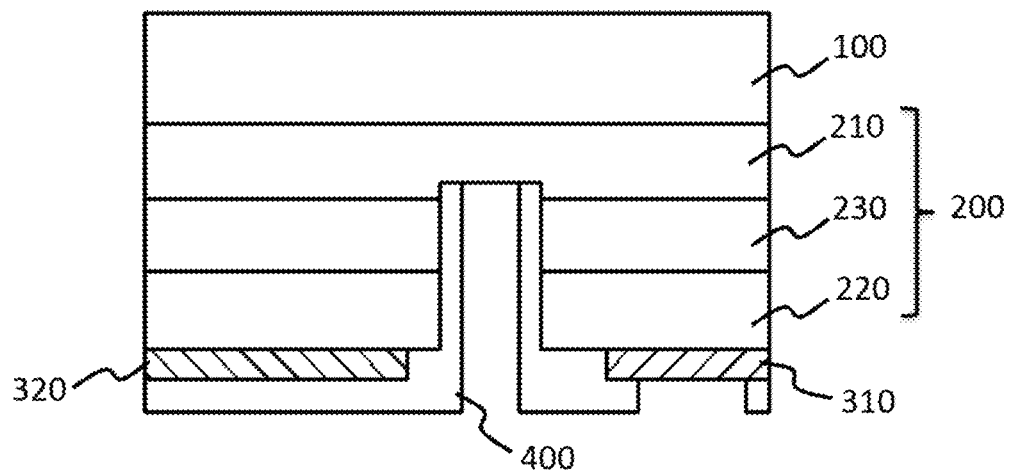
FIG. 2 is a diagram illustrating a structure manufactured by step 4 of the first embodiment.

Referring to FIG. 2, at step 4, a circuit having a conduction-passage is further manufactured. Vias are dug on the insulating layer 400 to remove a portion of an insulating material adopted as an electrical isolation barrier to expose at least the first-type semiconductor layer 210 located at the bottom of the recess and expose a portion of the first conduction layer 310.

Figure 3:
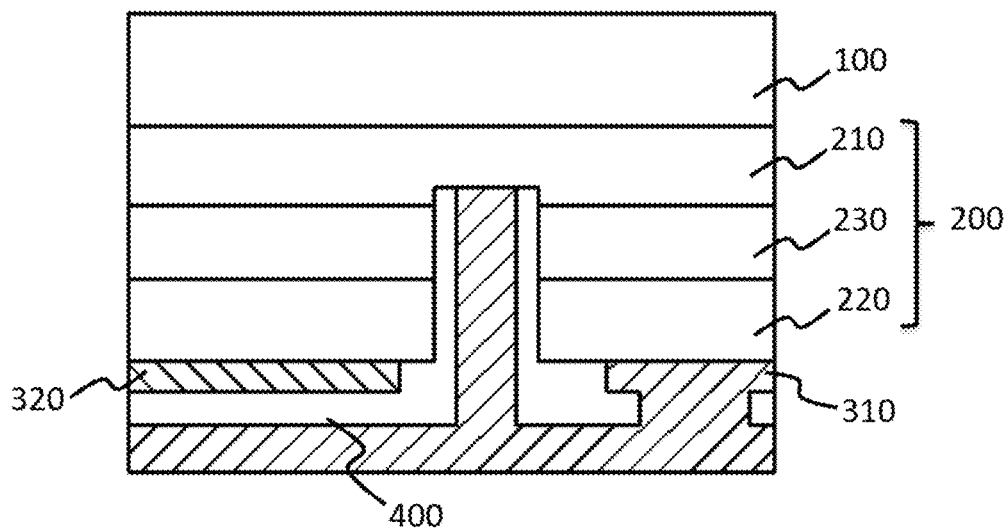
FIG. 3 is a diagram illustrating a structure manufactured by step 5 of the first embodiment.

Referring to FIG. 3, at step 5, the bottom of the recess, the insulating layer 400, and the at step 4 exposed portion of the first conduction layer 310 are further covered with the material of the first conduction layer 310, so as to facilitate to constitute an electrical connection between a first electrode 610 and the first-type semiconductor layer 210 by using the first conduction layer 310 to fill the recess. The material of the first conduction layer 310 in this step, such as Ni or Sn, has a melting point lower than the bonding temperature and has relatively good fluidity, which is advantageous to reduce pores at the engaging positions inside the first conduction layer 310 and increase the heat dissipation and reliability of the product.

Figure 4:
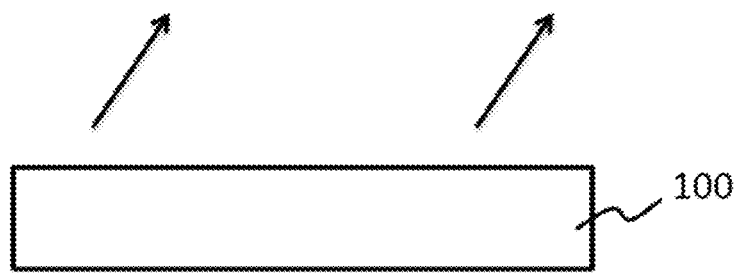
FIG. 4 is a diagram illustrating a structure manufactured by steps 6 and 7 of the first embodiment.
Figure 4:
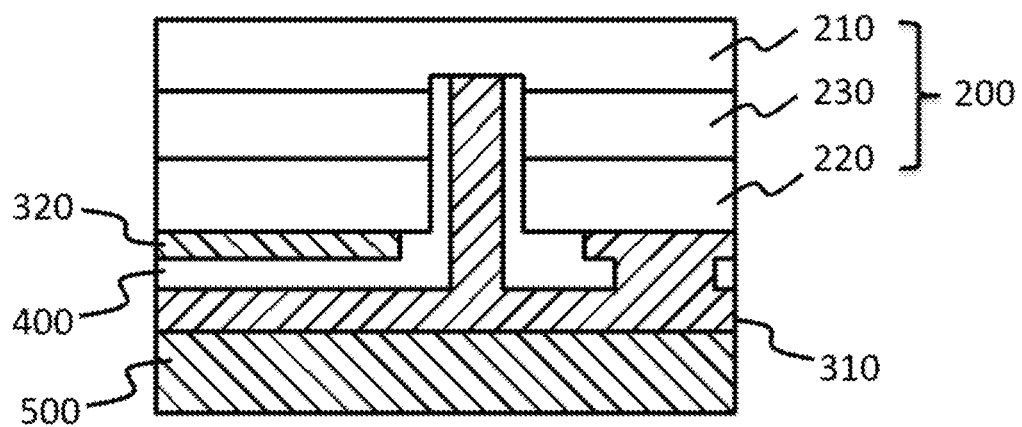

Referring to FIG. 4, at step 6, a back side of the first conduction layer 310 is directly connected to a base 500 configured for support and heat dissipation. This direct connection generally adopts a metal bonding process or an adhesively bonding process. When adopting the bonding process, it tends to form a bonding metal on the base 500 and the first conduction layer 310 prior to step 6. The bonding metal here is collectively referred to as the first conduction layer 310. At step 7, the growth substrate 100 is removed.

Figure 5:
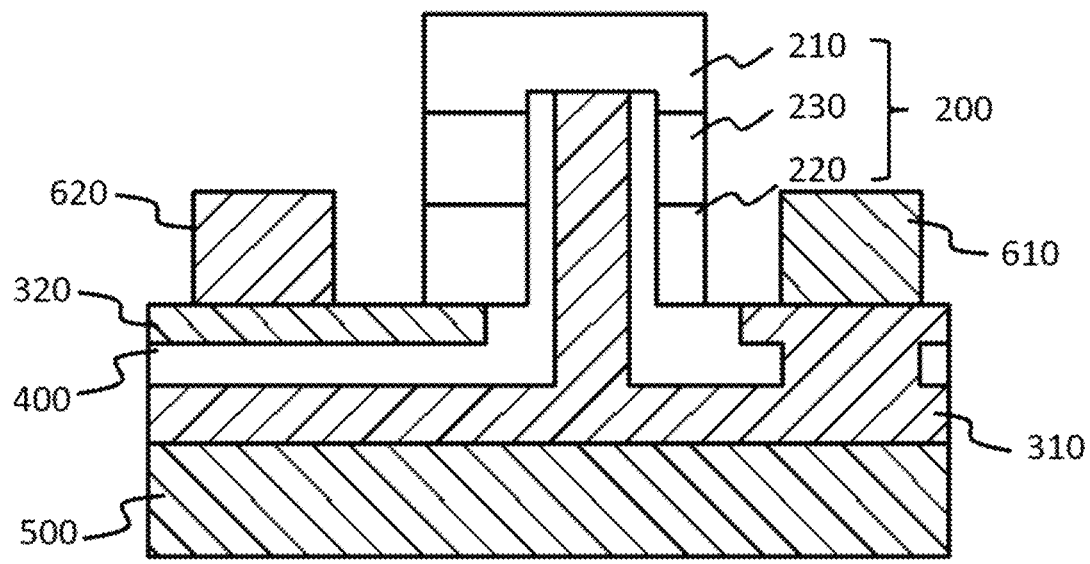
FIG. 5 is a diagram illustrating a structure manufactured by steps 8 and 9 of the first embodiment.

Referring to FIG. 5, the structures of steps 8 and 9 are illustrated. At step 8, a partial region of the semiconductor layer sequence 200 is removed from a front side of the first-type semiconductor layer 210. The semiconductor layer sequence 200 is removed to expose the first conduction layer 310 and the second conduction layer 320. An advantage of the process is that the semiconductor layer sequence 200 can be directly etched and removed to form an electrode window without removing difficult-to-remove materials such as the insulating dielectric or the conduction layer, which has a relatively simplified process, higher efficiency, and reliability. At step 9, the first electrode 610 is formed on the exposed first conduction layer 310, and a second electrode 620 is formed on the exposed second conduction layer 320.

In a second embodiment of the present disclosure, a light-emitting diode structure manufactured by using the above-mentioned processes is provided, which can improve the reliability and simplify the process of manufacturing a high-voltage chip.

Referring to FIG. 5, firstly provided are a semiconductor layer sequence 200 for radiation. The semiconductor layer sequence 200 has a first-type semiconductor layer 210, a second-type semiconductor layer 220, and an active layer 230 located between the first-type semiconductor layer 210 and the second-type semiconductor layer 220 and configured to generate radiation, wherein the first-type semiconductor layer 210 is adjacent to a front side of the semiconductor layer sequence 200. The semiconductor layer sequence 200 is, for example, based on III/V compound semiconductor materials or based on II/VI compound semiconductor materials. The II/V compound semiconductor materials have at least elements from the third main group, such as Al, Ga, In, and elements from the fifth main group, such as B, N, P, As. In particular, the term "III/V compound semiconductor materials" includes a group of binary, ternary or quaternary compounds containing at least one element from the third main group and at least one element from the fifth main group, and is especially nitride compound semiconductor and phosphide compound semiconductor. Such binary, ternary or quaternary compounds may furthermore, for example, have one or more dopants and additional components. Examples belonging to the III/V compound semiconductor materials include group III nitride compound semiconductor materials and group III phosphide compound semiconductor materials, such as GaN, GaAs, and InGaAlP. The semiconductor layer sequence 200 has a height from equal to or greater than 5 μm to equal to or less than 7 μm, or from greater than 7 μm to equal to or less than 8 μm. The height of the semiconductor layer sequence 200 here is not greater than 7 μm. Considering the process performance, the semiconductor layer sequence 200 is not less than 5 μm.

The semiconductor layer sequence 200 includes at least one recess covered by the insulating layer 400. In this embodiment, a number of the recesses is from 20 to 25. The recess extends from a back side of the semiconductor layer sequence 200 opposite to the front side through the active layer 230, and extends to the first-type semiconductor layer 210. A back side of the first conduction layer 310 is connected to a front side of the base 500. At least a portion of the first conduction layer 310 at the front side thereof is exposed for the arrangement of a first electrode 610. At least a portion of the second conduction layer 320 at the front side thereof is exposed for the arrangement of a second electrode 620. The exposed first conduction layer 310 and second conduction layer 320 are of equal height. The equal height is substantially referred that upper surfaces thereof are located on horizontal planes at the same height. This equal-height design is actually implemented by integrally forming the first conduction layer 310 and the second conduction layer 320 proximate to the semiconductor layer sequence 200. The first electrode 610 is connected to the first conduction layer 310, and the second electrode 620 is connected to the second conduction layer 320. The first electrode 610 and the second electrode 620 face towards the front side. The first electrode 610 and the second electrode 620 are substantially referred to metal electrodes used for packaging and wiring.

The first-type semiconductor layer 210 is electrically connected by the first conduction layer 310 extending through the recess. The contact area between the front side of the first conduction layer 310 and the back side of the first-type semiconductor layer 210 is greater than 1.5% of the area of the first-type semiconductor layer 210.

The first conduction layer 310 and the second conduction layer 320 are insulated from each other by the insulating layer 400 from the recess. The insulating layer 400 extending from the recess covers the back sides of the first conduction layer 310 and the second conduction layer 320. The fact that the insulating layer 400 cover the first conduction layer 310 is not referred to covering the entire back side of the first conduction layer 310, but only covering a partial region of the first conduction layer 310 to prevent the degradation of the heat dissipation. The material of the insulating layer 400 includes silicon oxide, silicon nitride, aluminum nitride, aluminum oxide or ceramics, and the first conduction layer 310 and/or the second conduction layer 320 are/is a metal.

The base 500 is configured for support and heat dissipation. The material of the base 50 is Si, Cu, or ceramic. Especially, for the chip adopting the ceramic base 500, on the one hand, the ceramic base 500 has good heat dissipation by cooperating with the first conduction layer 310 to better conduct the heat from the first conduction layer 310. On the other hand, due to the insulation characteristic of the ceramic base 500, it is advantageous to form a plurality of semiconductors arranged in a series-connection configuration and/or a parallel-connection configuration on the same base 500 of high-voltage products.

The material of the first conduction layer 310 and/or the second conduction layer 320 is Ag, Au, Ti, Al, Cr, Pt, TiW alloy, Ni, or any combination thereof. Specifically, in this embodiment, a portion of the first conduction layer 310 contacting the first electrode 610 and a portion of the second conduction layer 320 contacting the second electrode 620 are Ti, Pt, Au, Cr, TiW alloy, which have stable performance. The material of the first conduction layer 310 configured to be filled into the recess includes a reflection material such as Al, Cr, Ag, or the like. The second conduction layer 320 located under the light-emitting region sequentially includes ITO for a current spread, AG, Ni, or TiW for reflection of the light emitted from the light-emitting region, and stable metal Ti, Pt, Au, Cr, TiW, or the like for preventing the diffusion of the above-mentioned materials.

Figure 6:
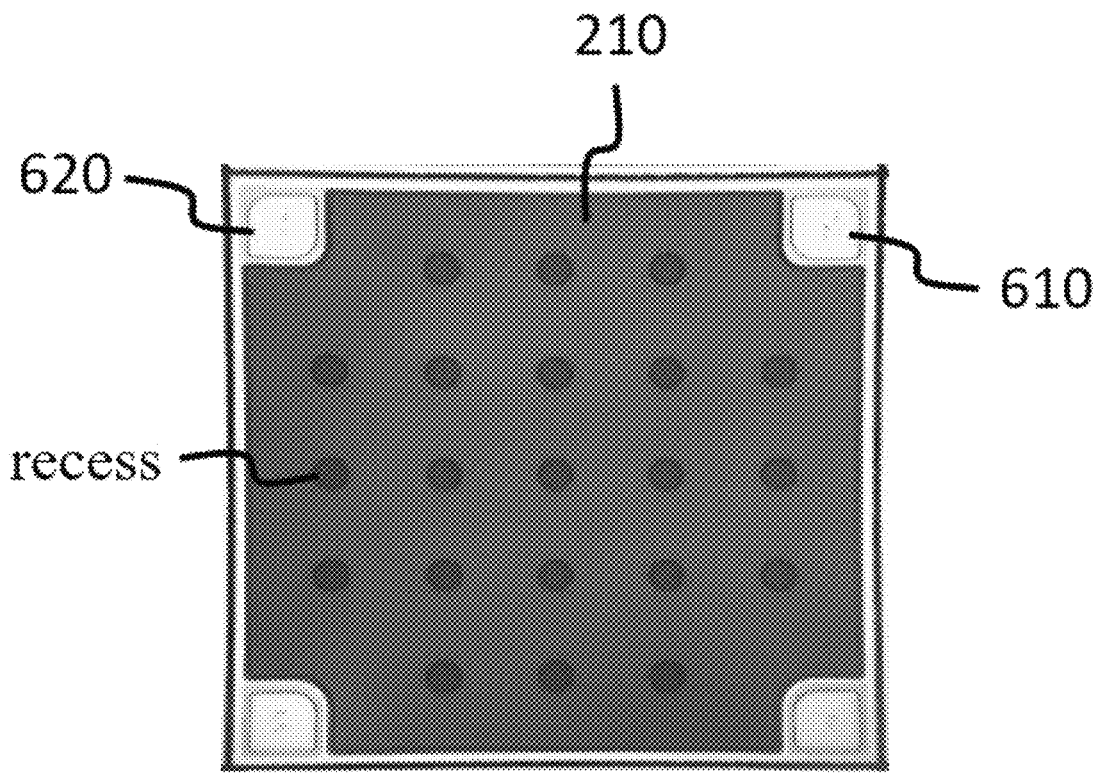
FIG. 6 is a top view illustrating a LED structure of the first embodiment.

Referring to FIG. 6, in order to further illustrate the structure of the embodiment, a top-viewed diagram of a chip illustrating the structure of the present disclosure in the top view is provided. In this diagram, a design can be observed, in which a plurality of recesses are uniformly distributed on the light-output surface, and this design has good current spread and heat dissipation. The first electrode 610 and the second electrode are disposed outside the chip. The structure of the light-emitting diode chip has simple and clear lamination-layers of materials, and has the advantages of simple manufacturing process and high reliability.

Figure 7:
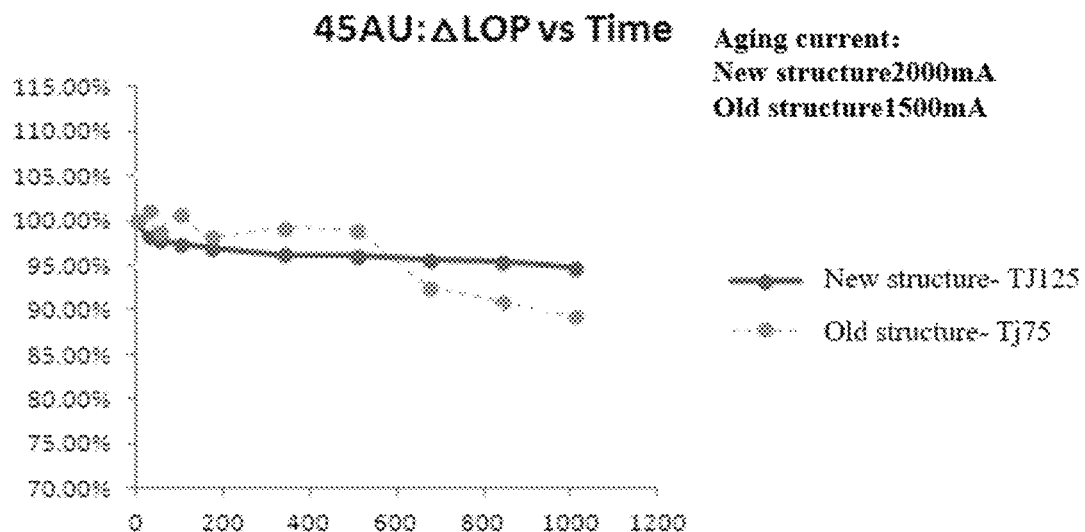
FIGS. 7 to 12 are graphs illustrating the comparison of aging data between the new structure of the first embodiment and the old structure in the prior art.
Figure 8:
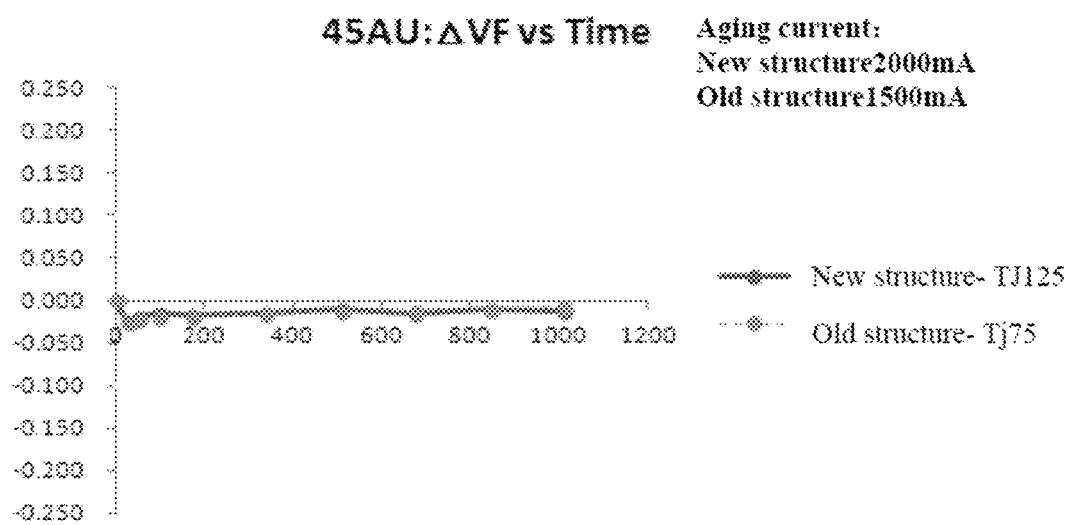
Figure 9:
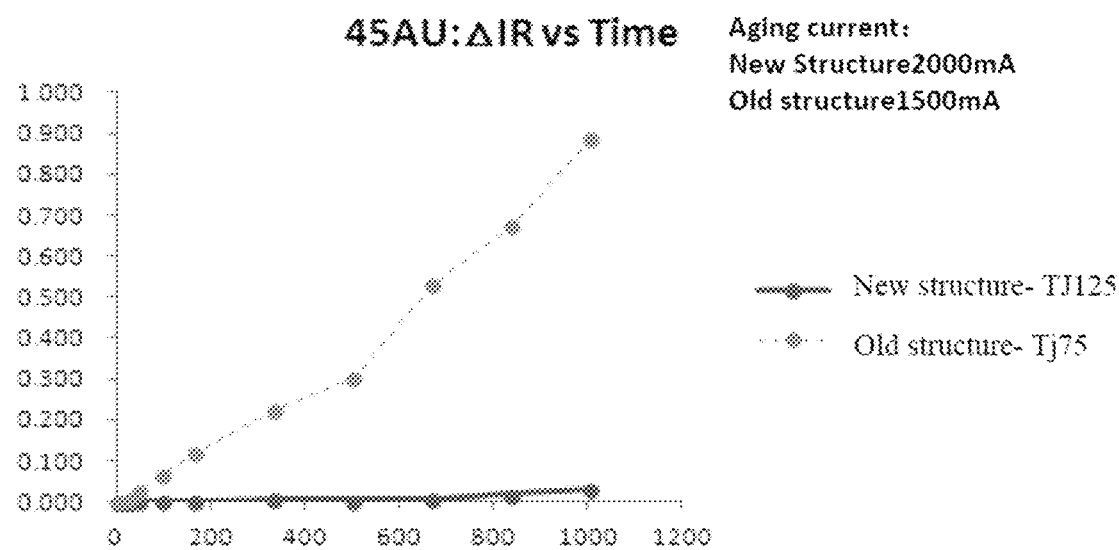

Referring to FIGS. 7 to 9, when performing an aging experiment under the condition of an external interference junction temperature, the conventional old structure quickly appears dead light at the junction temperature of 125° C. and under the condition of a current of 2000 mA. Therefore, more disadvantageous aging-test conditions are applied to the new structure of the present disclosure. An aging test is performed on the new structure at the junction temperature of 125° C. and under the condition of a current of 2000 mA, while an aging test is performed on the old structure at the junction temperature of 75° C. and under the condition of a current of 1500 mA. FIG. 7 illustrates the comparison of the new structure and the old structure in luminance ΔLOP over 1000 hours, and it can be observed that the new structure has less luminance fluctuation and better luminance stability over the 1000 hours. FIG. 8 illustrates the comparison of the new structure and the old structure in change ΔVF of forward voltages over 1000 hours, wherein ΔVF is the difference compared to the initial forward voltage. The difference between the two is not significant. FIG. 9 illustrates the comparison of the new structure and the old structure in leakage current ΔIR, wherein ΔIR is the difference compared to the initial leakage current. The new structure substantially has no leakage current, and the leakage current of the old structure gradually increases as the aging process progresses. Based on the above experiment data, it can be basically concluded that the new structure of the present disclosure is more reliable than the conventional old structure at high temperature and under the condition of high current density.

Figure 10:
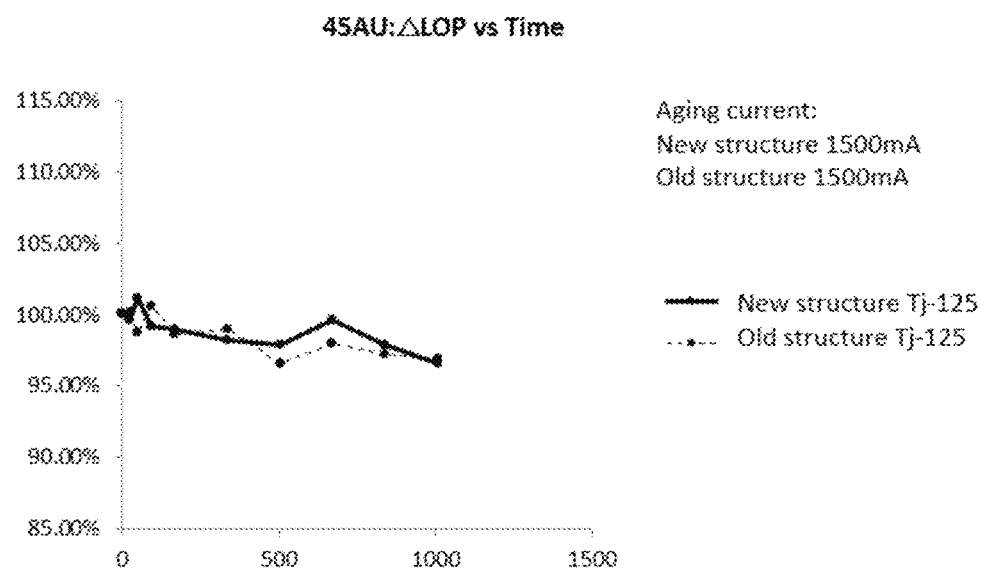
Figure 11:
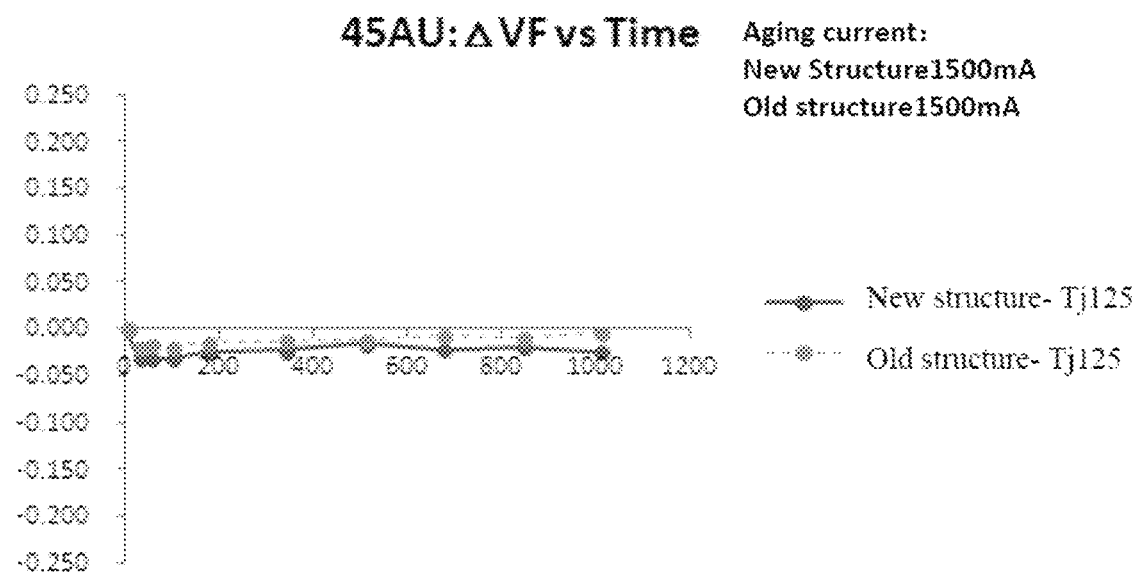
Figure 12:
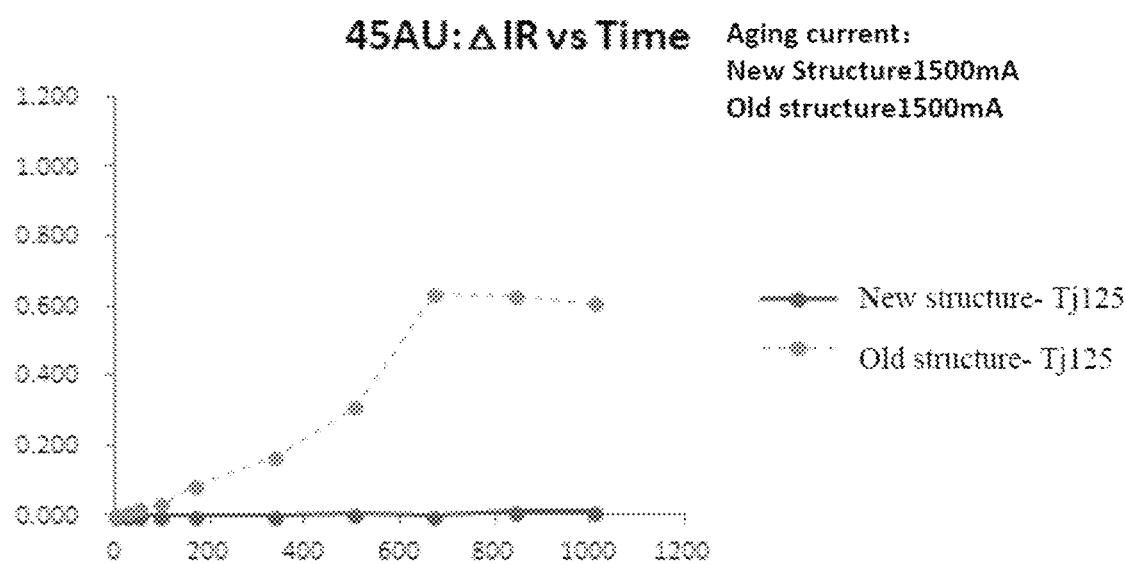

Referring to FIGS. 10 to 12, when performing an aging experiment under the condition of an external interference junction temperature, aging tests are performed on the new structure and the old structure both at the junction temperature of 125° C. and under the condition of a medium current density of 1500 mA. FIGS. 10 and 11 illustrate the comparisons of the new structure and the old structure in the luminance ΔLOP and in the change ΔVF of forward voltages over 1000 hours, and it can be observed that the difference between the new structure and the old structure over the 1000 hours is small, and the stabilities thereof are close to each other. FIG. 12 illustrates the comparison of the new structure and the old structure in the luminance ΔIR over 1000 hours. The new structure substantially has no leakage current, and the leakage current of the old structure gradually increases as the aging process progresses. Based on the above experiment data, it can be basically concluded that the new structure of the present disclosure is more reliable than the conventional old structure at high temperature and under the condition of medium and large current density.

A third embodiment is a variation of the second embodiment. In the embodiment, the contact area between the first conduction layer 310 and the back side of the first-type semiconductor layer 210 is increased, wherein the contact area is from equal to or greater than 2.3% to equal to or less than 2.8%, from greater than 2.8% to less than 4%, or from equal to or greater than 4% to equal to or less than 6%. The opening diameter of the recess is from equal to or greater than 15 μm to less than 32 μm. Distinguished from the previous embodiments, the direct contact area between the first conduction layer 310 and the first-type semiconductor layer 210 is increased to solve the heat dissipation problem of high-power products. The high-power products are, for example, large-size chips or high-voltage chips, and the like.

A forth embodiment is a modification of the third embodiment. Although the heat dissipation can be improved generally by ensuring the total contact area between the first conduction layer 310 and the first-type semiconductor layer 210, a thinner first conduction layer 310 has a thermal resistance beyond linear proportion when the opening diameter is comparably small. In order to ensure the heat dissipation in this case, the embodiment is designed to design the recess to have an opening diameter from equal to or greater than 32 μm to equal to or less than 40 μm. As a preferred embodiment, when the opening diameter of the recess is from equal to or greater than 34 μm to equal to or less than 36 μm, a number of the recesses is set to from 20 to 25.

Similar to the structures in the second embodiment to the forth embodiment, in a fifth embodiment, when the thickness of the first-type semiconductor layer 210 is designed to be relatively large, for example, the thickness is not less than 2 μm, a depth of the recess in the first type semiconductor layer 210 is dug to not less than 1 μm, thereby better conducting the heat from the first-type semiconductor layer 210. For example, the first-type semiconductor layer 210 has a thickness from 2 μm to 3 μm.

In a sixth embodiment of the present disclosure, the light-emitting diode chips of the first embodiment to the fifth embodiment are connected to each other through wirings. The first electrode 610 of the first light-emitting diode chip is connected to external circuit. The second electrode 620 of the first light-emitting diode chip is connected to the first electrode 610 of the second light-emitting diode chip through a gold wire. In such a way, a plurality of light-emitting diode chips are connected to one another sequentially in series through gold wires. The second electrode 620 of the last light-emitting diode chip is connected to the external circuit, thereby forming a series of light-emitting diode chips connected in series. In applications, the plurality of light-emitting diode chips connected in series generally have a relatively high operating voltage due to the fixed current of the external circuit. Compared to the other structures, the light-emitting diode chip having this structure can be easily adopted in a series-connection design, and has outstanding advantages of reliability under high voltage.

In a seventh embodiment of the present disclosure, a method of manufacturing a light-emitting diode element having a relatively simple process and high reliability is disclosed, which is used to manufacture a high-voltage light-emitting device. The method includes following steps of the process.

Figure 13:
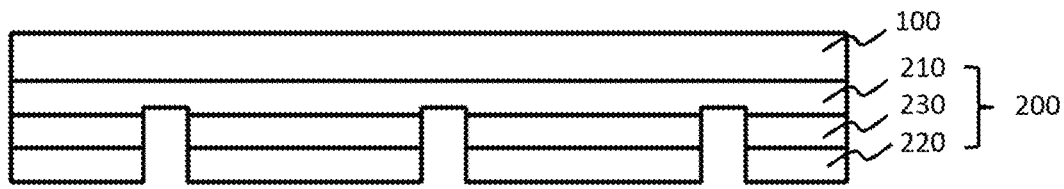
FIG. 13 is a diagram illustrating a structure manufactured by steps 1 and 2 of a seventh embodiment.

Referring to FIG. 13, at step 1, an epitaxial structure of a light-emitting diode element is firstly formed. A semiconductor layer sequence 200 is formed on a growth substrate 100. The semiconductor layer sequence 200 includes a first-type semiconductor layer 210, an active layer 230, and a second-type semiconductor layer 220, which constitute a semiconductor PN-junction. At step 2, a plurality of recesses extending through the second-type semiconductor layer 220 and the active layer 230 are dug from a back side of the second-type semiconductor layer 220, and the recesses extend at least to the first-type semiconductor layer 210.

Figure 14:
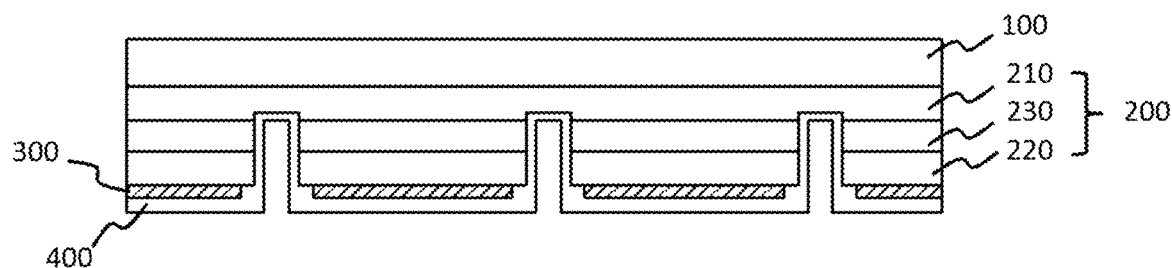
FIG. 14 is a diagram illustrating a structure manufactured by step 3 of the seventh embodiment.

Referring to FIG. 14, at step 3, a non-recessed region on a surface of the second-type semiconductor layer 220 is covered with a conduction layer 300. The conduction layer is discretely distributed for corresponding graphic design made for subsequent circuit connections. The conduction layer includes n pairs of a first conduction and a second conduction layer located on the same horizontal plane. Each pair of the first conduction layer and the second conduction layer is located in an individual semiconductor layer sequence 200 that is made subsequently, where n≥2. Then, each portion of the conduction layer, a bottom and a side wall of the recess is covered with an insulating layer 400.

Figure 15:
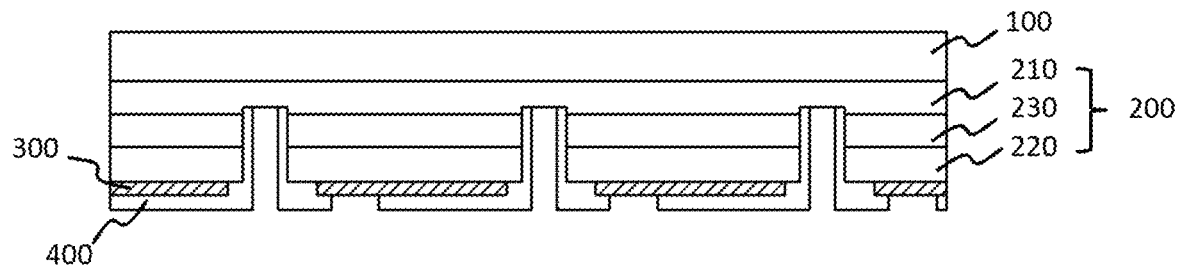
FIG. 15 is a diagram illustrating a structure manufactured by step 4 of the seventh embodiment.

Referring to FIG. 15, at step 4, vias are dug in some regions of the insulating layer 400 to expose at least the first-type semiconductor layer 210 at the bottom of the recess and n partial regions of the first conduction layer. The exposed first-type semiconductor layer 210 at the bottom of the recess and the n first conduction layers are used to form windows for electrical connections.

Figure 16:
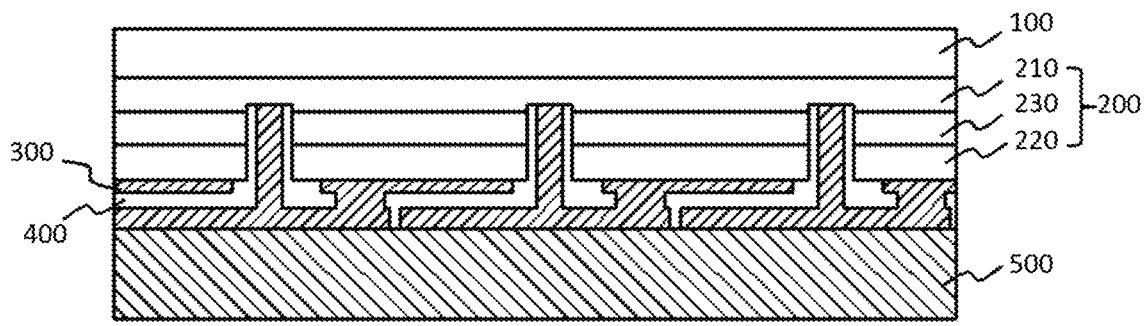
FIG. 16 is a diagram illustrating a structure manufactured by step 5 of the seventh embodiment.

Referring to FIG. 16, at step 5, the bottom of the recess, the insulating layer 400, and the partial regions of the n first conduction layers are further covered with the material of the first conduction layer. The first conduction layers referred here are substantially referred to the collectively defined first conduction layer formed by a plurality of material layers together. The insulating layer 400 is disposed between the n first conduction layers for isolation. The electrical connection is spread through the material of the newly covered first conduction layer to the first conduction layer made in step 3 and having the same height as the second conduction layer.

Figure 17:
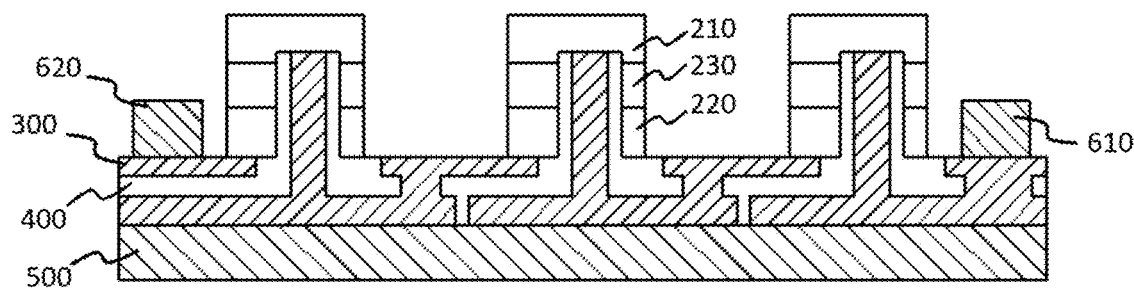
FIG. 17 is a diagram illustrating a structure manufactured by steps 6 to 9 of the seventh embodiment.

Referring to FIG. 17, at step 6, a back side of the first conduction layer is directly connected to a heat-dissipation base 500. The heat-dissipation base 500 includes ceramic or metal. This direct connection generally adopts a metal bonding process or an adhesively bonding process. When adopting the bonding process, it tends to form a bonding metal on the base 500 and the first conduction layer prior to step 6. The bonding metal here is collectively referred to as the first conduction layer. At step 7, the growth substrate 100 is removed. Removing the growth substrate 100 here includes removing the entire growth substrate 100 or thinning the growth substrate 100. At step 8, a portion of the semiconductor layer sequence 200 is to be removed from a front side of the first-type semiconductor layer 210 to expose the first conduction layer and the second conduction layer. Since due to this process the semiconductor layer sequence 200 can be directly removed to the relatively stable material of the first conduction layer and the second conduction layer, the controllability of the process is good, and n semiconductor layer sequence 200 isolated from each other are formed. At step 9, a first electrode 610 is formed on the first conduction layer exposed by a first semiconductor layer sequence 200, and a second electrode 620 is formed on the second conduction layer exposed by a last semiconductor layer sequence 200. The first electrode 610 and the second electrode 620 are used to be connected to an external circuit.

Referring to FIG. 17, according to the above-mentioned process, the structure of the light-emitting diode element mainly used for high-voltage devices is provided. In an eighth embodiment of the present disclosure, in this structure, the light-emitting diode units are connected to one another in series. The light-emitting diode element includes 3 to 6, or 6 to 9 light-emitting diode units. In order to achieve the series connection, the semiconductor layer sequence 200 between the light-emitting diode units are isolated from each other, and the light-emitting diode units constitute an electrical series connection by the conduction layer in the semiconductor layer sequence 200. The semiconductor layer sequence 200 includes an active layer 230 located between a first-type semiconductor layer 210 and a second-type semiconductor layer 220 and configured to generate radiation, wherein the first-type semiconductor layer 210 is located at a front side of the semiconductor layer sequence 200. The semiconductor layer sequence 200 includes one or more recesses covered with an insulating layer 400. The recess is used as a current passage extending from a back side of the semiconductor layer sequence 200 opposite to the front side through the active layer 230 and extending to the first-type semiconductor layer 210. The first conduction layer having conduction characteristics extends through the recess and is electrically connected to the first-type semiconductor layer 210. The second conduction layer having conduction characteristics is electrically connected to the second-type semiconductor layer 220. The first conduction layer and the second conduction layer are insulated from each other by the insulating layer 400 extending from the recess. The first light-emitting diode unit of the plurality of light-emitting diode units exposes at least a portion of the first conduction layer, and has a first electrode 610 electrically connected to the exposed first conduction layer of the first light-emitting diode unit. The last light-emitting diode unit exposes at least a portion of the second conduction layer, and has a second electrode 620 electrically connected to the second conduction layer of the last light-emitting diode unit. The first electrode 610 and the second electrode 620 are located outside the light-emitting diode element, and the first electrode 610 and the second electrode 620 face towards the front side.

The back side of the first conduction layer is connected to the front side of the base 500. The contact area between the front side of the first conduction layer and the back side of the first-type semiconductor layer 210 is greater than 1.5% of the area of the first-type semiconductor layer 210. The insulating layer 400 extending from the recess covers the back side of the second conduction layer. The second conduction layer of one of any two adjacent light-emitting diode units and the first conduction layer of the other light-emitting diode unit are provided with a connection portion integrally connected thereto. The first conduction layers of the two adjacent light-emitting diode units are isolated from each other by the insulating layer 400. Some regions of the light-emitting diode unit include the second conduction layer, the insulating layer 400, and the first conduction layer, which are stacked sequentially from top to bottom.

The plurality of light-emitting diode units share the same support and heat-dissipation base 500. In some thin-film light-emitting diode elements, the semiconductor layer sequence 200 have a height not higher than 7 μm.

In this embodiment, the first conduction layer and/or the second conduction layer are/is substantially metal, and can be provided with materials for current spread, such as ITO used for current spread. At least a portion of integrally connected connection portion is exposed between the semiconductor layer sequence 200 isolated from each other. The structure is substantially advantageous that the removing process needs only to be perform up to the connection portion when forming the semiconductor layer sequence 200 isolated from each other, which is easy to be controlled in the processes.

Figure 18:
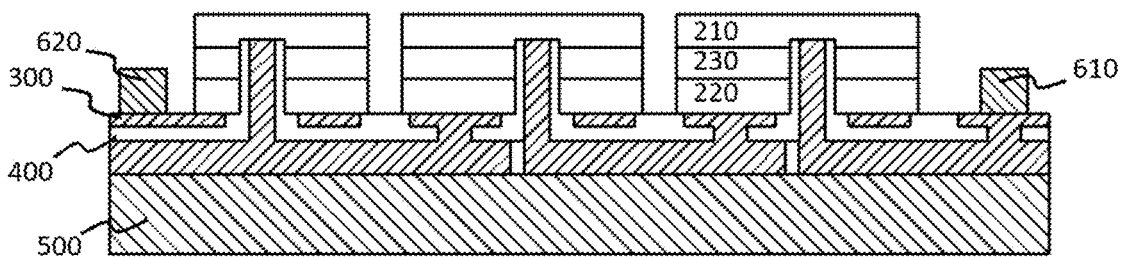
FIG. 18 is a diagram illustrating a LED structure of a ninth embodiment.

Referring to FIG. 18, in order to protect the connection portion, reduce direct impact of the environment or even damage on the connection, the present disclosure provides a ninth embodiment according to the above-mentioned the eighth embodiment. A portion of the insulating layer 400 in each light-emitting diode unit is exposed from the front side. At least a portion of integrally connected connection portion is located under the portion of the insulating layer 400. In terms of the structure, this structure can be achieved, as long as the position of the insulating layer 400 for isolation is to be changed in a horizontal direction at step 5, and the position which the semiconductor layer sequence 200 are removed to at step 8 is to be changed to expose the insulating layer 400.

In the eighth embodiment and the ninth embodiment, the plurality of light-emitting diode units are formed by integrally growing the semiconductor layer sequence 200 on the same growth substrate 100. The plurality of light-emitting diode units have identical chip structures, that is, a repeated unit structure can be observed in FIGS. 11 and 12.

In a tenth embodiment of the present disclosure, under the high voltage of the plurality of semiconductor layer sequence 200 connected in series, the contact area between the first conduction layer and back side of the first-type semiconductor layer 210 is increased. The contact area is designed to be from equal to or greater than 4% to equal to or less than 6% of the area of the first-type semiconductor layer 210.

It should be understood that the above specific embodiments are only part of the preferred embodiments of the present disclosure, and the above-mentioned embodiments can also be combined to each other and modified in various ways. The scope of the present disclosure is not limited to the above-mentioned embodiments, and any changes made according to the present disclosure fall within the protection scope of the present disclosure.

What is claimed is:

1. A light-emitting diode chip, comprising:
    a semiconductor layer sequence comprising a first-type semiconductor layer, a second-type semiconductor layer, and an active layer located between the first-type semiconductor layer and the second-type semiconductor layer and configured to generate radiation, wherein the first-type semiconductor layer is located at a front side of the semiconductor layer sequence, the semiconductor layer sequence having a recess with at least one side wall thereof covered with an insulating layer, the recess extending from a back side of the semiconductor layer sequence opposite to the front side through the active layer and extending to the first-type semiconductor layer;
    a first conduction layer and a second conduction layer located at the back side of the semiconductor layer sequence, the second conduction layer directly contacting a back side of the second-type semiconductor layer, the first conduction layer and the second conduction layer are insulated from each other by the insulating layer, wherein dug vias are formed on the insulating layer, to expose the first-type semiconductor layer at a bottom of the recess and a portion of the first conduction layer;
    a first electrode connected to the first conduction layer and electrically connected to the first-type semiconductor layer by a material of the first conduction layer covering the exposed portion of the first conduction layer, the insulating layer and the exposed first-type semiconductor layer at the bottom of the recess and extending through the recess;
    a second electrode connected to the second conduction layer; and
    a base for support and heat-dissipation;
    wherein the first electrode and the second electrode face towards the front side of the semiconductor layer sequence, a back side of the first conduction layer being directly connected to a front side of the base, a contact area between a front side of the first conduction layer and a back side of the first-type semiconductor layer being greater than 1.5% of an area of the first-type semiconductor layer, at least a portion of the front side of the first conduction layer being exposed for the arrangement of the first electrode, at least a portion of a front side of the second conduction layer being exposed for the arrangement of the second electrode, and the insulating layer extending from the recess and covering a back side of the second conduction layer.

2. The light-emitting diode chip of claim 1, wherein the contact area between the first conduction layer and the back side of the first-type semiconductor layer is from equal to or greater than 2.3% to equal to or less than 2.8%, from greater than 2.8% to less than 4%, or from equal to 4% or greater than 4% to equal to or less than 6% of the area of the first-type semiconductor layer.

3. The light-emitting diode chip of claim 1, wherein the recess has an opening diameter from equal to or greater than 15 μm to less than 32 μm, or from equal to or greater than 32 μm to equal to or less than 40 μm.

4. The light-emitting diode chip of claim 1, wherein when the recess has an opening diameter from equal to or greater than 34 μm to equal to or less than 36 μm, a number of the recess is from 20 to 25.

5. The light-emitting diode chip of claim 1, wherein the first-type semiconductor layer has a thickness not less than 2 μm, and the recess in the first-type semiconductor layer has a depth not less than 0.6 μm.

6. The light-emitting diode chip of claim 1, wherein the first-type semiconductor layer has a thickness of 2 μm to 3 μm.

7. The light-emitting diode chip of claim 1, wherein the first conduction layer covers an entire front side of the base.

8. The light-emitting diode chip of claim 1, wherein a material of the first conduction layer and/or the second conduction layer comprises Ag, Au, Al, Cr, Ni, Pt, Sn, Ti, TiW, or any combination thereof.

9. The light-emitting diode chip of claim 1, wherein the first conduction layer comprises an ohmic-contact layer, a metal reflection layer, a metal bonding layer, or any combination thereof.

10. The light-emitting diode chip of claim 1, wherein the second conduction layer comprises a transparent conduction layer, a metal reflection layer, a metal-diffusion blocking layer, or any combination thereof.

11. The light-emitting diode chip of claim 1, wherein the semiconductor layer sequence has a height from equal to or greater than 5 μm to equal to or less than 7 μm, or from greater than 7 μm to equal to or less than 8 μm.

12. The light-emitting diode chip of claim 1, wherein a thermal conductivity coefficient of the base is not less than 150 W/(m·k) at 100° C.

13. The light-emitting diode chip of claim 1, wherein a material of the base is ceramic, Si, or Cu.

14. The light-emitting diode chip of claim 1, wherein the first conduction layer and the second conduction layer are at least partially formed integrally and located on the same plane.

15. The light-emitting diode chip of claim 1, wherein a part of the insulating layer that extends out of the recess is disposed between the back side of the second conduction layer and the front side of the first conduction layer.

16. The light-emitting diode chip of claim 1, wherein the exposed first conduction layer and the exposed second conduction layer are of equal height.

17. A method of manufacturing a light-emitting diode chip, comprising steps:
    step 1, forming a semiconductor layer sequence on a growth substrate, the semiconductor layer sequence comprising a first-type semiconductor layer, an active layer, and a second-type semiconductor layer;

step 2, digging a plurality of recesses extending through the second-type semiconductor layer and the active layer from a back side of the second-type semiconductor layer, the recesses extending at least to the first-type semiconductor layer;

step 3, covering a non-recessed region on a surface of the second-type semiconductor layer with a conduction layer, the conduction layer comprising a first conduction layer and a second conduction layer located on the same horizontal plane, and covering the conduction layer, a bottom and a side wall of the recess with an insulating layer;

step 4, digging vias on the insulating layer, and exposing the first-type semiconductor layer at the bottom of the recess and a portion of the first conduction layer;

step 5, further covering the bottom of the recess, the insulating layer, and the portion of the first conduction layer with a material of the first conduction layer;

step 6, connecting directly a back side of the first conduction layer to a heat-dissipation base;

step 7, removing the growth substrate;

step 8, removing a portion of the semiconductor layer sequence from a front side of the first-type semiconductor layer to expose the first conduction layer and the second conduction layer;

step 9, forming a first electrode on the exposed first conduction layer, and forming a second electrode on the exposed second conduction layer.

18. A light-emitting diode element, comprising a plurality of light-emitting diode units, each light-emitting diode unit comprising:

a semiconductor layer sequence comprising a first-type semiconductor layer, a second-type semiconductor layer, and an active layer located between the first-type semiconductor layer and the second-type semiconductor layer and configured to generate radiation, wherein the first-type semiconductor layer is located at a front side of the semiconductor layer sequence, the semiconductor layer sequence having a recess with at least one side wall thereof covered with an insulating layer, the recess extending from a back side of the semiconductor layer sequence opposite to the front side through the active layer and extending to the first-type semiconductor layer; and a first conduction layer and a second conduction layer located at the back side of the semiconductor layer sequence, the first conduction layer extending through the recess and being connected to the first-type semiconductor layer, the second conduction layer directly contacting a back side of the second-type semiconductor layer, the first conduction layer and the second conduction layer being insulated from each other by the insulating layer, wherein dug vias are formed on the insulating layer, to expose the first-type semiconductor layer at a bottom of the recess and a portion of the first conduction layer; the exposed first-type semiconductor layer at the bottom of the recess and the exposed portion of the first conduction layers are used to form a window for electrical connection;

wherein the plurality of light-emitting diode units share the same support and heat-dissipation base, a back side of the first conduction layer being directly connected to a front side of the base, and a contact area between a front side of the first conduction layer and a back side of the first-type semiconductor layer being greater than 1.5% of an area of the first-type semiconductor layer;

wherein the second conduction layer of one of any two adjacent light-emitting diode units and of the other light-emitting diode unit are integrally connected by a connection portion.

19. The light-emitting diode element of claim 18, wherein the plurality of light-emitting diode units comprises a first light-emitting diode unit and a last light-emitting diode unit, the first conduction layer of the first light-emitting diode unit being exposed for the arrangement of a first electrode, the first conduction layer of the last light-emitting diode unit being exposed for the arrangement of a second electrode.

* * * * *